(12) United States Patent
Lo et al.

(10) Patent No.: US 9,026,883 B2
(45) Date of Patent: May 5, 2015

(54) DECODING APPARATUS WITH ADAPTIVE CONTROL OVER EXTERNAL BUFFER INTERFACE AND TURBO DECODER AND RELATED DECODING METHOD THEREOF

(71) Applicant: MediaTek Singapore Pte. Ltd., Singapore (SG)

(72) Inventors: Chiaming Lo, Tustin, CA (US); Yi-Chang Liu, Taoyuan County (TW); Lawrence Chen Lee, Miaoli County (TW); Wei-Yu Lai, Kaohsiung (TW); Wei-De Wu, Hsinchu (TW)

(73) Assignee: MediaTek Singapore Pte. Ltd., Singapore (SG)

( * ) Notice: Subject to any disclaimer, the term of this patent is extended or adjusted under 35 U.S.C. 154(b) by 132 days.

(21) Appl. No.: 13/798,200

(22) Filed: Mar. 13, 2013

(65) Prior Publication Data

US 2014/0281843 A1 Sep. 18, 2014

(51) Int. Cl.
| | |
|---|---|
| *H03M 13/00* | (2006.01) |
| *H03M 13/09* | (2006.01) |
| *G06F 11/08* | (2006.01) |
| *H04L 1/00* | (2006.01) |
| *H04L 1/18* | (2006.01) |
| *H03M 13/29* | (2006.01) |

(52) U.S. Cl.
CPC .............. *H03M 13/09* (2013.01); *G06F 11/08* (2013.01); *H03M 13/2957* (2013.01); *H04L 1/0059* (2013.01); *H04L 1/1896* (2013.01); *H04L 1/005* (2013.01); *H03M 13/2975* (2013.01); *H03M 13/6306* (2013.01)

(58) Field of Classification Search
CPC ..... H04L 1/0059; H04L 1/1896; H04L 1/005; H04L 1/004; H03M 13/2957; H03M 13/09; G06F 11/08
USPC ......... 714/758, 748, 786, 792, 794, 795, 799, 714/807, 808
See application file for complete search history.

(56) References Cited

U.S. PATENT DOCUMENTS

| | | | | |
|---|---|---|---|---|
| 7,225,384 | B2 * | 5/2007 | Heo et al. ....................... | 714/749 |
| 7,924,753 | B2 * | 4/2011 | Attar et al. .................... | 370/310 |
| 2009/0296798 | A1 * | 12/2009 | Banna et al. ................... | 375/229 |
| 2010/0061475 | A1 * | 3/2010 | Mo et al. ........................ | 375/261 |
| 2011/0154170 | A1 * | 6/2011 | Challa et al. ................... | 714/807 |
| 2013/0262952 | A1 * | 10/2013 | Hahm et al. ................... | 714/751 |
| 2014/0053049 | A1 * | 2/2014 | Chen et al. ..................... | 714/807 |
| 2014/0247909 | A1 * | 9/2014 | Niewczas et al. .............. | 375/340 |

* cited by examiner

*Primary Examiner* — John P Trimmings
(74) *Attorney, Agent, or Firm* — Winston Hsu; Scott Margo

(57) ABSTRACT

A decoding apparatus has an on-chip buffer, an external buffer interface, and a turbo decoder. The on-chip buffer is arranged for buffering each code block to be decoded. The external buffer interface is arranged for accessing an off-chip buffer. The turbo decoder is arranged for decoding a specific code block read from the on-chip buffer. The specific code block is not transmitted from the on-chip buffer to the off-chip buffer via the external buffer interface unless decoding fail of the specific code block is identified.

21 Claims, 13 Drawing Sheets

| Code block idx | 1 | 2 | 3 | 4 | 5 | 6 |
|---|---|---|---|---|---|---|
| Decoding fail | N | N | N | N | N | N |
| Adaptive iteration | N | N | N | N | N | N |
| EMI Active | N | N | N | N | N | N |
| Turbo decoder Active | Y | Y | Y | Y | Y | Y |
| Iteration_idx=1 | 0x1F4BAE | 0x4764BF | 0x0F7CA0 | 0x20887F | 0x00517A | 0x088E19 |
| Iteration_idx=2 | 0xB3E029 | 0x36FA9D | 0x07301E | 0x117A12 | 0x15CCA7 | 0x047417 |
| Iteration_idx=3 | 0x27A992 | 0xC80A36 | 0x021741 | 0x099963 | 0x047417 | 0x049AFB |
| Iteration_idx=4 | 0x51DEAF | 0x51DEAF | 0x061A3B | 0x099963 | 0x03DFF9 | 0x0E30AA |
| Iteration_idx=5 | 0x43242C | 0x51DEAF | 0x061A3B | | 0x125E8A | 0x0E30AA |
| Iteration_idx=6 | 0x35B7EC | | | | 0x125E8A | |
| Iteration_idx=7 | 0x35B7EC | | | | | |
| Iteration_idx=8 | | | | | | |

Correct TB CRC

FIG. 6

| Code block idx | 1 | 2 | 3 | 4 | 5 | 6 ← Wrong TB CRC |
|---|---|---|---|---|---|---|
| Decoding fail | N | N | Y (HDA CRC fail) | Y (TTI ET) | Y (TTI ET) | Y (TTI ET) |
| Adaptive iteration | N | N | N | Y | Y | Y |
| EMI Active | N | N | Y | Y | Y | Y |
| Turbo decoder Active | Y | Y | Y | N | N | N |
| Iteration_idx=1 | 0x1F4BAE | 0x4764BF | 0x0F7CA0 | | | |
| Iteration_idx=2 | 0xB3E029 | 0x36FA9D | 0x07301E | | | |
| Iteration_idx=3 | 0x27A992 | 0xC80A36 | 0x021741 | | | |
| Iteration_idx=4 | 0x51DEAF | 0x51DEAF | 0x061A3B | | | |
| Iteration_idx=5 | 0x43242C | 0x51DEAF | 0x1F4BAE | | | |
| Iteration_idx=6 | 0x35B7EC | | 0x4764BF | | | |
| Iteration_idx=7 | 0x35B7EC | | 0x27A992 | | | |
| Iteration_idx=8 | | | 0x20887F | | | |

FIG. 7

| Code block idx | 1 | 2 | 3 | 4 | 5 | 6 (Wrong TB CRC) |
|---|---|---|---|---|---|---|
| Decoding fail | N | N | N | N | N | N |
| Adaptive iteration | N | N | N | N | N | N |
| EMI Active | N | N | N | N | N | N |
| Turbo decoder Active | Y | Y | Y | Y | Y | Y |
| Iteration_idx=1 | 0x1F4BAE | 0x4764BF | 0x0F7CA0 | 0x20887F | 0x00517A | 0x088E19 |
| Iteration_idx=2 | 0xB3E029 | 0x36FA9D | 0x07301E | 0x117A12 | 0x15CCA7 | 0x047417 |
| Iteration_idx=3 | 0x27A992 | 0xC80A36 | 0x021741 | 0x099963 | 0x047417 | 0x049AFB |
| Iteration_idx=4 | 0x51DEAF | 0x51DEAF | 0x061A3B | 0x099963 | 0x03DFF9 | 0x0E30AA |
| Iteration_idx=5 | 0x43242C | 0x51DEAF | 0x061A3B | | 0x125E8A | 0x0E30AA |
| Iteration_idx=6 | 0x35B7EC | 0x3EBAD0 | | | 0x125E8A | |
| Iteration_idx=7 | 0x35B7EC | 0x3EBAD0 | | | | |
| Iteration_idx=8 | | | | | | |

FIG. 8

DECODING APPARATUS WITH ADAPTIVE CONTROL OVER EXTERNAL BUFFER INTERFACE AND TURBO DECODER AND RELATED DECODING METHOD THEREOF

BACKGROUND

The disclosed embodiments of the present invention relate to decoding code blocks by using a turbo decoder, and more particularly, to a decoding apparatus with adaptive control over an external buffer interface and a turbo decoder and related decoding method thereof.

Data signals, in particular those transmitted over a typically hostile channel, are susceptible to channel noise/interference. Various methods of error correction coding have been developed in order to minimize the adverse effects that a hostile channel has on the integrity of the transmitted data. This is also referred to as lowering the bit error rate (BER), which is generally defined as the ratio of incorrectly received information bits to the total number of received information bits. Error correction coding generally involves representing digital data in ways designed to be robust with respect to error bits. Hence, error correction coding may enable a communications system to recover original data from a signal that has been corrupted due to the undesired channel noise/interference. For example, turbo codes may be used in the communications system, such as a Wideband Code Division Multiple Access (WCDMA) system and a Long Term Evolution (LTE) system, for channel coding.

It is possible that a turbo decoder encounters decoding fail when decoding code blocks/transport blocks. A hybrid automatic repeat request (HARQ) mechanism may be active when the decoding fail occurs. The HARQ mechanism is a transmission technique that combines automatic repeat request (ARQ) and forward error correction (FEC) by requesting a retransmission whenever data is detected as incorrect and combining the new transmission with the previous one for a higher reliability in the wireless channels. That is, the HARQ mechanism exploits information of the erroneous data after retransmission. Due to its superior reliability, the HARQ mechanism becomes a crucial component of the communications system. Although the performance advantage is very attractive, implementing the HARQ mechanism is a challenge for high throughput communications systems. Specifically, a large amount of data needs to be stored in the HARQ buffer. In general, data is stored in a cheaper external shared HARQ memory instead of an expensive internal dedicated HARQ memory. That is, the conventional receiver design stores each code block to be decoded into the external HARQ memory. However, compared to reading data from and writing data into the internal HARQ memory, reading data from the external shared HARQ memory and writing data into the external shared HARQ memory would have higher power consumption. Further, the external shared HARQ memory may be an off-chip memory (e.g., a dynamic random access memory) which is also used by other hardware components for data buffering. Thus, the HARQ mechanism has to compete with other hardware components to access the shared memory bus of the off-chip memory. When the shared memory bus is busy, frequently accessing the off-chip memory for reading/writing HARQ data may have degraded performance.

Besides, when decoding a transport block, the conventional turbo decoder is generally arranged to decode each code block by using a fixed number of iterations. However, using a fixed number of iterations will cause performance loss for lower throughput communications systems and design difficulty for higher throughput communications systems. Though the conventional turbo decoder may employ a code block based early termination to skip remaining iterations for stopping the iterative decoding procedure of a code block earlier, it may not be enough for a low-power receiver design.

Thus, there is a need for an innovative decoder design which is capable of achieving improvement and balance on cost, power consumption and system performance.

SUMMARY

In accordance with exemplary embodiments of the present invention, a decoding apparatus with adaptive control over an external buffer interface and a turbo decoder and related decoding method thereof are proposed, to solve the above-mentioned problem.

According to a first aspect of the present invention, an exemplary decoding apparatus is disclosed. The exemplary decoding apparatus includes an on-chip buffer, an external buffer interface, and a turbo decoder. The on-chip buffer is arranged for buffering each code block to be decoded. The external buffer interface is arranged for accessing an off-chip buffer. The turbo decoder is arranged for decoding a specific code block read from the on-chip buffer. The specific code block is not transmitted from the on-chip buffer to the off-chip buffer via the external buffer interface unless decoding fail of the specific code block is identified.

According to a second aspect of the present invention, an exemplary decoding method is disclosed. The exemplary decoding method includes: utilizing an on-chip buffer for buffering each code block to be decoded; performing a turbo decoding operation for decoding a specific code block read from the on-chip buffer; and transmitting the specific code block from the on-chip buffer to an off-chip buffer via an external buffer interface only when decoding fail of the specific code block is not identified.

According to a third aspect of the present invention, an exemplary decoding method is disclosed. The exemplary decoding method includes: performing a turbo decoding operation upon a specific code block which has a dedicated cyclic redundancy check (CRC) sequence in a codeword, wherein the turbo decoding operation further verifies correctness of an iterative decoding result of the specific code block according to the dedicated CRC sequence; performing a hard decision aided (HDA) CRC operation by: encoding a plurality of hard decision outputs respectively derived from a plurality of decoding iterations performed by the turbo decoding operation upon the specific code block and accordingly generating a plurality of HDA CRC sequences, and referring to the HDA CRC sequences to verify correctness of the iterative decoding result of the specific code block; and checking if a decoding fail of the specific code block occurs according to verification results indicated by the turbo decoding operation and the HDA CRC operation.

According to a fourth aspect of the present invention, an exemplary decoding method is disclosed. The exemplary decoding method includes: performing a turbo decoding operation upon a first transport block which includes a plurality of code blocks; checking if a decoding fail of a specific code block of the code blocks occurs; and when the decoding fail of the specific code block is identified, controlling the turbo decoding operation to stop decoding each subsequent code block of the first transport block.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 6 is a diagram illustrating a first operational scenario of the decoding apparatus shown in FIG. 5 according to an embodiment of the present invention.

FIG. 7 is a diagram illustrating a second operational scenario of the decoding apparatus shown in FIG. 5 according to an embodiment of the present invention.

FIG. 8 is a diagram illustrating a third operational scenario of the decoding apparatus shown in FIG. 5 according to an embodiment of the present invention.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
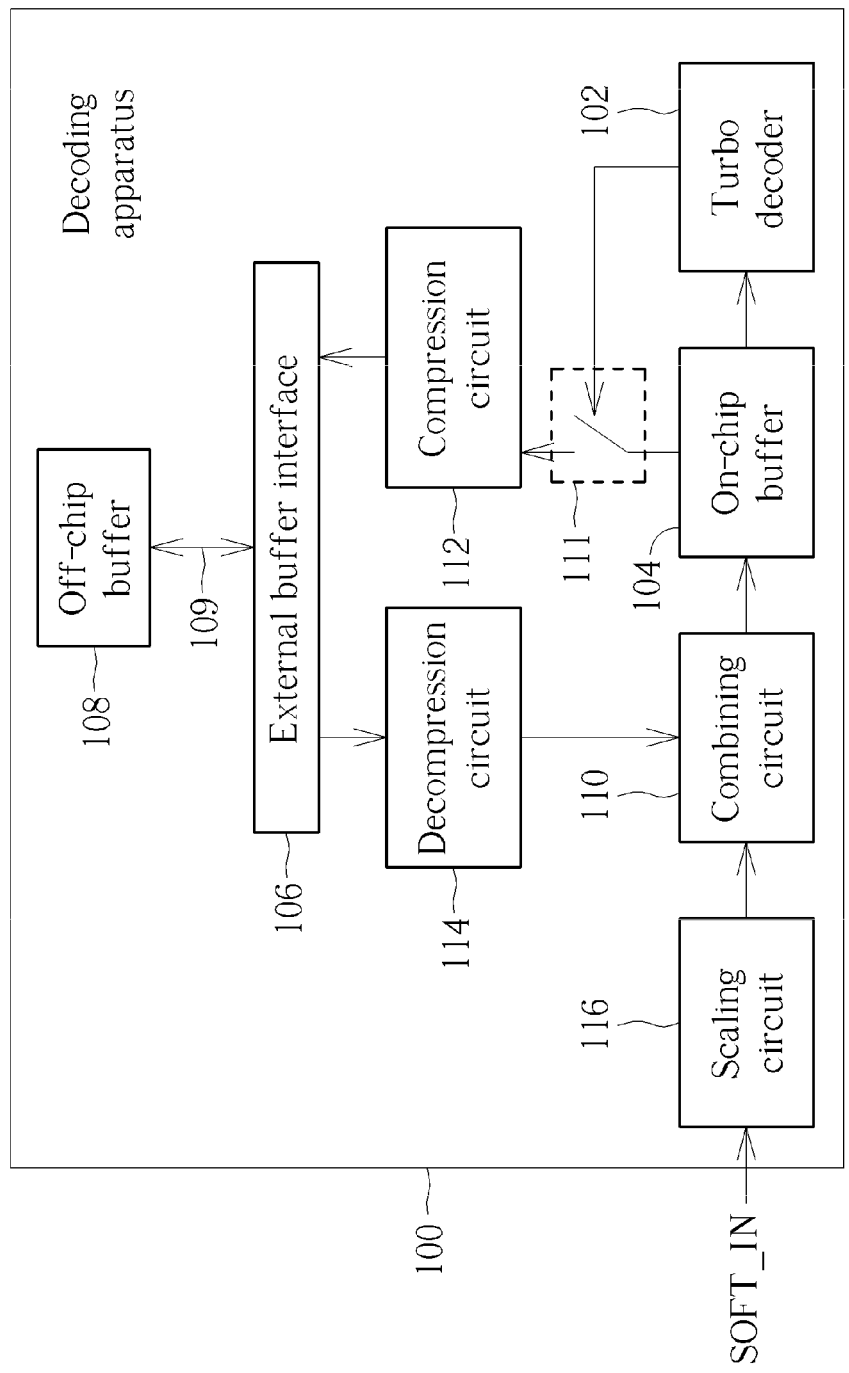
FIG. 1 is a block diagram illustrating a decoding apparatus according to a first embodiment of the present invention.

FIG. 1 is a block diagram illustrating a decoding apparatus according to a first embodiment of the present invention. The decoding apparatus 100 may be employed in a communications system complying with a specific communications specification (e.g., an LTE specification) which specifies that a transport block in each codeword has a dedicated cyclic redundancy check (CRC) sequence, and each code block of the transport block also has a dedicated CRC sequence. As shown in FIG. 1, the decoding apparatus 100 includes a turbo decoder 102, an on-chip buffer 104, an external buffer interface 106, an off-chip buffer 108, a combining circuit 110, a bus switch 111, a compression circuit 112, a decompression circuit 114, and a scaling circuit 116. It should be noted that the compression circuit 112, the decompression circuit 114 and the scaling circuit 116 may be optional, depending upon actual design consideration/requirement. Particularly, when the compression circuit 112 and the decompression circuit 114 are implemented, the amount of data transaction between the external buffer interface 106 and the off-chip buffer 108 can be effectively reduced, thus relaxing the bandwidth requirement of the bus 109 between the external buffer interface 106 and the off-chip buffer 108. When the scaling circuit 116 is employed, a bit size of a soft bit to be decoded by the turbo decoder 102 can be reduced, thus reducing the die size. As the present invention focuses on the adaptive control applied to the external buffer interface 106 and/or the turbo decoder 102, further description of the compression circuit 112, the decompression circuit 114 and the scaling circuit 116 is omitted here for brevity.

The decoding apparatus 100 receives a modulator-demodulator (MODEM) soft input SOFT_IN from a preceding stage such as a receiver front-end (not shown). When the HARQ mechanism is active for a specific code block having decoding fail, the combining circuit 110 combines the retransmission (i.e., the currently received MODEM soft input SOFT_IN of the specific code block) with a previous transmission (i.e., the previously received MODEM soft input SOFT_IN of the specific code block) to generate a combined version of the MODEM soft input SOFT_IN to the following on-chip buffer 104. When the incoming MODEM soft input SOFT_IN is a specific code block which is not decoded before, the combining circuit 110 bypasses the currently received MODEM soft input SOFT_IN to the following on-chip buffer 104 without retransmission combination. The on-chip buffer 104 is arranged to temporarily store each code block included in a transport block to be decoded. The turbo decoder 102 therefore decodes each code block read from the on-chip buffer 104.

In this embodiment, each code block of a transport block has a dedicated CRC sequence, the turbo decoder 102 is able to judge whether the currently decoded code block has a decoding fail due to failing to pass a CRC check. It should be noted that a code block is not transmitted from the on-chip buffer 104 to the off-chip buffer 108 via the external buffer interface 106 unless decoding fail of the code block is identified. That is, the decoding apparatus 100 is not required to transmit any code block buffered in the on-chip buffer 104 to the off-chip buffer 108. Instead, the decoding apparatus 100 transmits a code block from the on-chip buffer 104 to the off-chip buffer 108 via the external buffer interface 106 only when decoding fail of the code block is identified. By way of example, but not limitation, the on-chip buffer 104 may be a static random access memory (SRAM) disposed in a chip where the turbo decoder 102 is located, the off-chip buffer 108 may be a dynamic random access memory (DRAM) disposed outside the chip where the turbo decoder 102 is located, and the external buffer interface 106 may be an external memory interface (EMI) of the chip. In this embodiment, the turbo decoder 102 controls the bus switch 111 to enable or disable the code block transmission between the on-chip buffer 104 and the off-chip buffer 108. However, this is for illustrative purposes only. In practice, any means capable of enabling/disabling the code block transmission/

HARQ data transmission between the on-chip buffer 104 and the off-chip buffer 108 may be employed by the decoding apparatus 100.

Since the code block transmission/HARQ data transmission between the on-chip buffer 104 and the off-chip buffer 108 consumes much power and only the code block failing to pass the CRC check (i.e., the erroneous code block) is required to be sent to a HARQ memory (i.e., the off-chip buffer 108) for future processing/decoding, the overall system power consumption can be reduced due to the proposed external buffer interface activity reduction. It should be noted that the HARQ process, including retransmission and combination, is applied to erroneous code blocks stored in the off-chip buffer 108 only.

Moreover, a proposed transmission time interval (TTI) early-termination (ET) scheme may be employed to further reduce the overall system power consumption. Specifically, a transport block to be decoded includes a plurality of code blocks transmitted in one TTI, and the code blocks are sequentially transmitted to the on-chip buffer 104. When decoding fail of a specific code block of the transport block is identified by the CRC check, the turbo decoder 102 stops decoding any subsequent code block of the same transport block. In other words, the decoding operation of one transport block transmitted in one TTI is stopped earlier in response to code block decoding fail detected using code block CRC check.

Besides, the turbo decoder 102 directly identifies decoding fail of any subsequent code block of the same transport block. Hence, any subsequent code block of the same transport block is also transmitted from the on-chip buffer 104 to the off-chip buffer 108 via the external buffer interface 106. Since no decoding operation is performed upon any subsequent code block which is not decoded yet, the turbo decoder 102 employs the proposed TTI early-termination scheme can have lower power consumption. It should be noted that the CRC content of the last CRC passed code block within the same transport block would be stored for future processing.

To put it simply, in accordance with the proposed TTI early-termination scheme, decoding fail of a current code block is identified by the turbo decoder 102 when decoding of the current code block reaches a maximum allowed iteration number and still fails to pass the CRC check, or decoding of the current code block is early terminated due to a previous code block with CRC fail.

Figure 2:
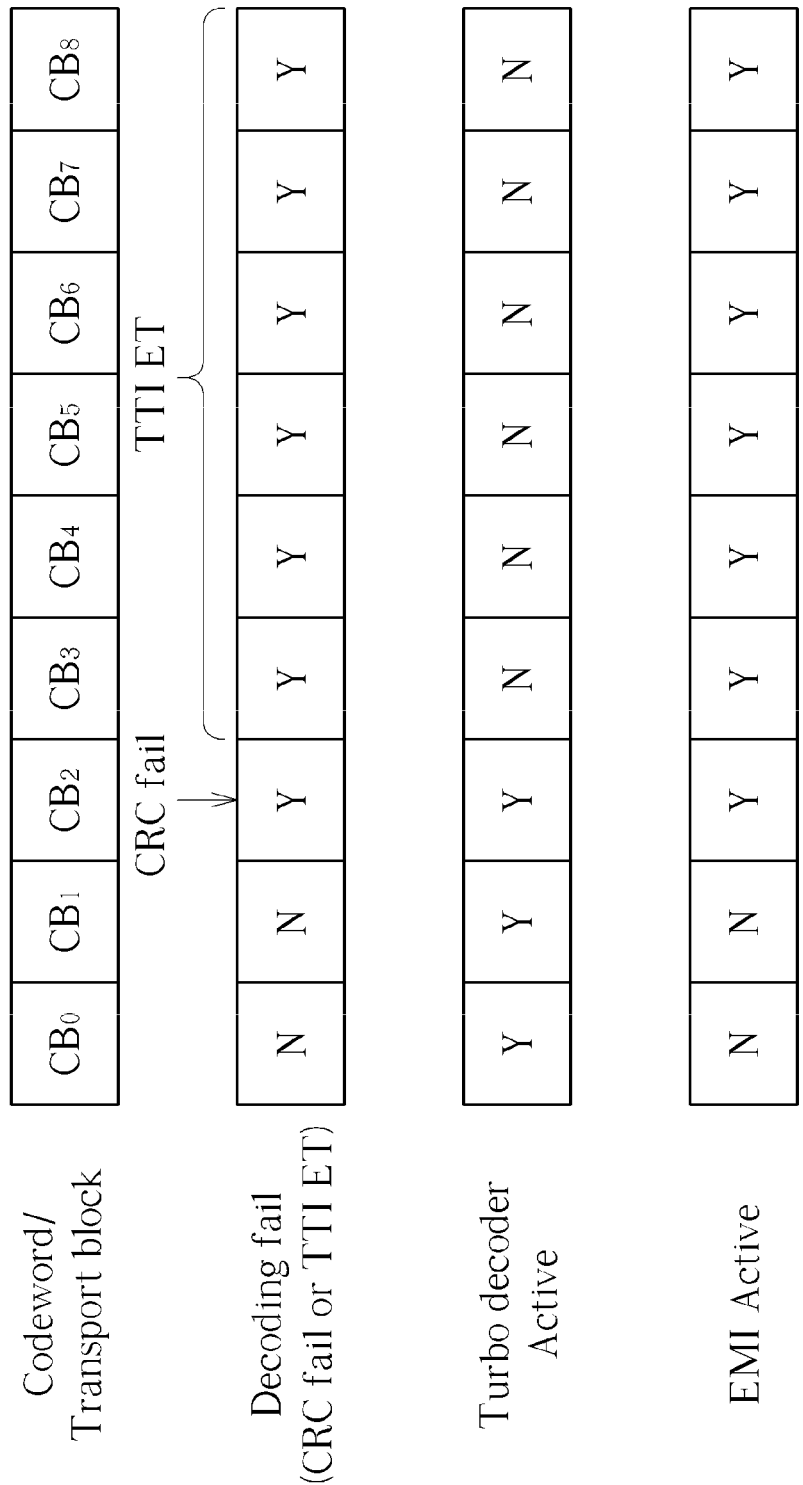
FIG. 2 is a diagram illustrating the TTI early-termination (early-termination performed within a TTI) and the external buffer interface activity reduction according to an embodiment of the present invention.

Please refer to FIG. 2, which is a diagram illustrating the TTI early-termination (early-termination performed within a TTI) and the external buffer interface activity reduction according to an embodiment of the present invention. Assume that a codeword/transport block transmitted in a current TTI includes nine code blocks $CB_0$-$CB_8$ transmitted successively. Hence, the turbo decoder 102 is required to decode the code blocks $CB_0$-$CB_8$ sequentially if the TTI early-termination is not active. Thus, the turbo decoder 102 is initially active to read the first code block $CB_0$ from the on-chip buffer 104, and performs iterative decoding upon the code block $CB_0$ according to a maximum allowed iteration number initially indicated by a higher layer. In this example, the decoding result of the code block $CB_0$ successfully passes the CRC check when or before the number of iterations performed by the iterative decoding operation reaches the maximum allowed iteration number. As the decoding of the code block $CB_0$ has no decoding fail, implying that the code block $CB_0$ can be correctly decoded by the turbo decoder 102, no HARQ data transaction between the on-chip buffer 104 and the off-chip buffer 108 is needed for the code block $CB_0$. Hence, the external buffer interface 106 remains inactive for power saving purpose.

As decoding of the code block $CB_0$ has no decoding fail, the turbo decoder 102 is still active to read the following code block $CB_1$ from the on-chip buffer 104, and performs iterative decoding upon the code block $CB_1$ according to the maximum allowed iteration number. In this example, the decoding result of the code block $CB_1$ successfully passes the CRC check when or before the number of iterations performed by the iterative decoding operation reaches the maximum allowed iteration number. As the decoding of the code block $CB_1$ has no decoding fail, implying that the code block $CB_1$ can be correctly decoded by the turbo decoder 102, no HARQ data transaction between the on-chip buffer 104 and the off-chip buffer 108 is needed for the code block $CB_1$. Hence, the external buffer interface 106 still remains inactive.

Similarly, as decoding of the code block $CB_1$ has no decoding fail, the turbo decoder 102 is still active to read the following code block $CB_2$ from the on-chip buffer 104, and performs iterative decoding upon the code block $CB_2$ according to the maximum allowed iteration number. In this example, the decoding result of the code block $CB_2$ is unable to pass the CRC check when the number of iterations performed by the iterative decoding operation has reached the maximum allowed iteration number. In other words, a CRC fail of the code block $CB_2$ occurs. As the decoding of the code block $CB_2$ has decoding fail (i.e., CRC fail), implying that the code block $CB_2$ can not be correctly decoded by the turbo decoder 102, the HARQ data transaction between the on-chip buffer 104 and the off-chip buffer 108 is needed for the code block $CB_2$. Hence, the external buffer interface 106 is enabled to be active for transmitting the code block $CB_2$ from the on-chip buffer 104 to the off-chip buffer 108.

As the code block $CB_2$ is found having decoding fail due to CRC fail, the decoding of subsequent code blocks $CB_3$-$CB_8$ of the same codeword/transport block transmitted in one TTI are early terminated and regarded as having decoding fail. Hence, the turbo decoder 102 does not need to decode subsequent code blocks $CB_3$-$CB_8$ and thus enters an inactive state for subsequent code blocks $CB_3$-$CB_8$. Besides, the external buffer interface 106 remains active for transmitting the code blocks $CB_3$-$CB_8$, which are directly regarded as having decoding fail due to TTI early termination (TTI ET), from the on-chip buffer 104 to the off-chip buffer 108.

When decoding a code block, the turbo decoder 102 keeps performing the iterative decoding operation until a decoding result passes the CRC check (when or before the number of iterations performed by the iterative decoding operation reaches the maximum allowed iteration number) or the decoding result fails to pass the CRC check (when the number of iterations performed by the iterative decoding operation reaches the maximum allowed iteration number). It is possible that multiple codewords/transport blocks are transmitted in one TTI. For example, to support multi-PDSCH (Physical Downlink Shared Channel), four codewords CW1, CW2, CW3, CW4 may be transmitted in one TTI, where CW1/CW2 has 13 code blocks, and CW3/CW4 has 1 code block. The present invention further proposes using an adaptive iteration design which dynamically adjusts the maximum allowed iteration number to improve the overall decoding performance. For example, the on-chip buffer 104 is arranged for buffering a plurality of code blocks of a first transport block to be decoded and buffering a plurality of code blocks of a second transport block to be decoded, where a first codeword, including the first transport block and associated CRC information, and a second codeword, including the second transport block and associated CRC information, are both transmitted in the same TTI. When the decoding fail of a specific code block of the first transport block is identified, the turbo decoder 102 may adjust a maximum allowed iteration number, and then decode at least one code block of the second transport block according to the adjusted maximum allowed iteration number. Specifically, the maximum allowed iteration number would be increased to improve the possibility of obtaining a correctly decoded result. When decoding of code block(s) in one transport block is early terminated, the computing resource originally dispatched to decoding these early-terminated code block(s) may be allocated to decoding code block(s) of another transport block with an increased maximum allowed iteration number, thus improving the decoding performance of code block(s) of another transport block. In practice, the maximum allowed iteration number Niter depends on the computing power of the turbo decoder. Thus, the number of code blocks to be decoded in one TTI dominates the maximum allowed iteration number Niter. By way of example, but not limitation, the maximum allowed iteration number Niter may be set by following equation:

Niter=min(32,floor(16*26/$TC$)), where TC represents a total code block number per TTI (i.e., the number of code blocks that are not early terminated and still required to be decoded in one TTI), and the turbo decoder is assumed to run 16*26 half iterations per TTI with maximum of 32 half iterations per code block. For example, when the communications system operates at 150 Mbps and four codewords are transmitted in one TTI (i.e., CW=4 (13, 13, 1, 1), where CW1/CW2 has 13 code blocks, and CW3/CW4 has one code block), Niter=14 due to TC=28. When the communications system operates at 100 Mbps and four codewords are transmitted in one TTI (i.e., CW=4 (9, 9, 1, 1), where CW1/CW2 has 9 code blocks, and CW3/CW4 has one code block), Niter=20 due to TC=20. When the communications system operates at 100 Mbps and two codewords are transmitted in one TTI (i.e., CW=2 (9, 9), where CW1/CW2 has 9 code blocks), Niter=23 due to TC=18. To put it simply, low throughput would use a larger maximum allowed iteration number (e.g., 32) at low signal-to-noise (SNR), while high throughput would use a smaller maximum allowed iteration number (e.g., 14) at high SNR. To put it simply, the maximum allowed iteration number is adaptively determined by the transport block configuration and the status of the decoding progress.

Figure 3:
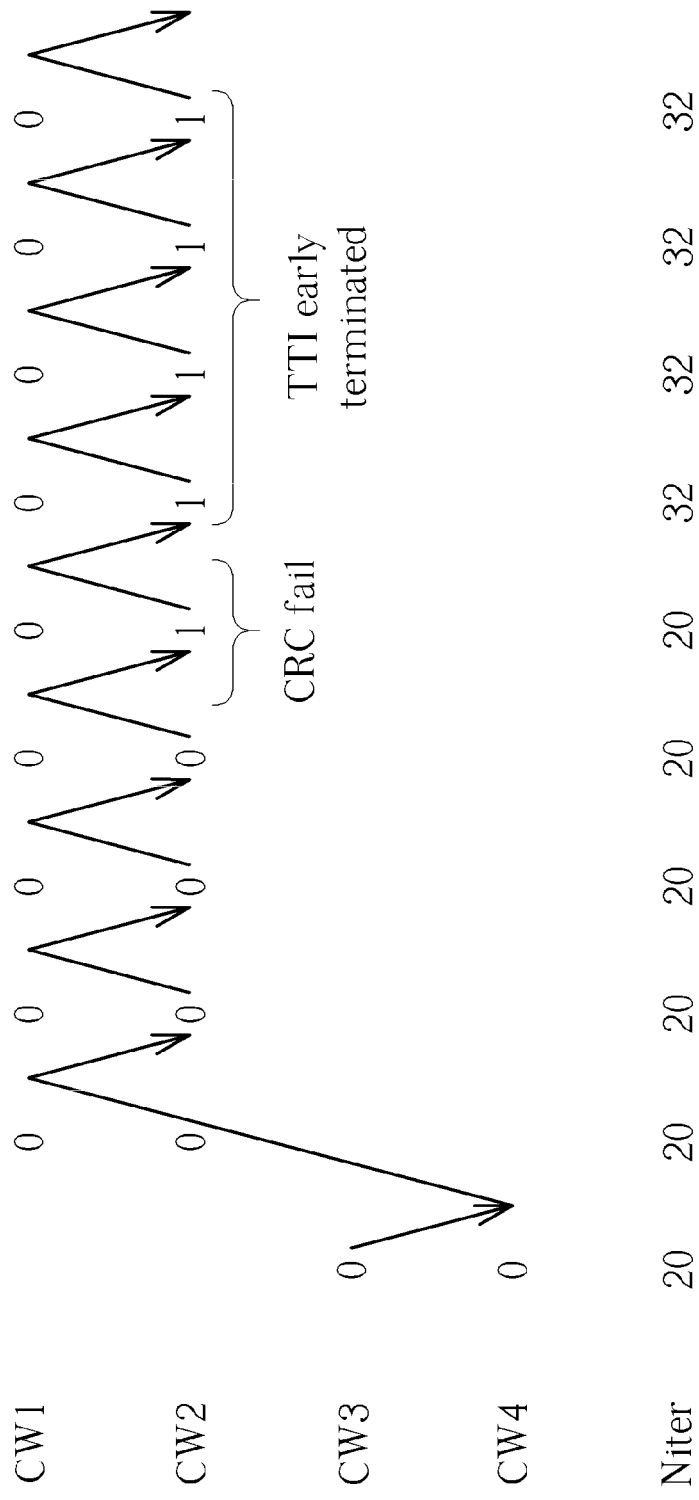
FIG. 3 is a diagram illustrating an adaptive iteration scheme according to an embodiment of the present invention.

Please refer to FIG. 3, which is a diagram illustrating an adaptive iteration scheme according to an embodiment of the present invention. In the example of FIG. 3, the system operates at 100 Mbps with four codewords transmitted in one TTI (i.e., CW=4 (9, 9, 1, 1)). The decoding sequence is illustrated by the arrow symbols. As can be seen from FIG. 3, decoding fail of the $5^{th}$ code block of the codeword CW2 occurs due to CRC fail. Hence, decoding of the subsequent code blocks of the codeword CW2 is early terminated. Besides, the subsequent code blocks of the codeword CW2 are regarded as having decoding fail due to TTI early termination. Initially, the maximum allowed iteration number is set by 20. When the decoding fail of the $5^{th}$ code block of the codeword CW2 is identified, the turbo decoder 102 adjusts the maximum allowed iteration number, and then decodes code blocks of the codeword CW1 according to the adjusted maximum allowed iteration number (i.e., Niter=32).

Figure 4:
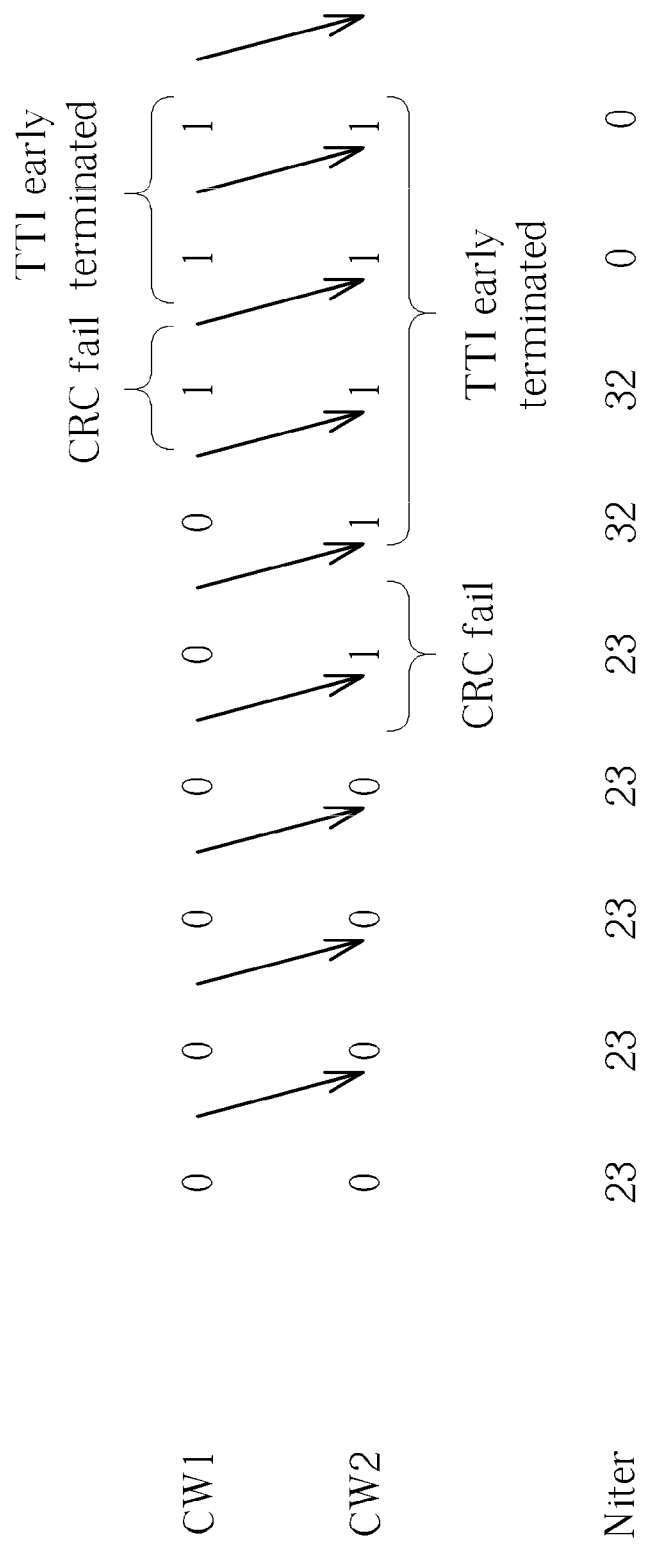
FIG. 4 is a diagram illustrating an adaptive iteration scheme according to another embodiment of the present invention.

Please refer to FIG. 4, which is a diagram illustrating an adaptive iteration scheme according to another embodiment of the present invention. In the example of FIG. 4, the system operates at 100 Mbps with two codewords transmitted in one TTI (i.e., CW=2 (9, 9)). The decoding sequence is illustrated by the arrow symbols. As can be seen from FIG. 4, decoding fail of the $5^{th}$ code block of the codeword CW2 occurs due to CRC fail. Hence, decoding of the subsequent code blocks of the codeword CW2 is early terminated. Besides, the subsequent code blocks of the codeword CW2 are regarded as having decoding fail due to TTI early termination. Initially, the maximum allowed iteration number is set by 23. When the decoding fail of the $5^{th}$ code block of the codeword CW2 is identified, the turbo decoder 102 adjusts the maximum allowed iteration number, and then decodes the $6^{th}$ code block and $7^{th}$ code block of the codeword CW1 according to the adjusted maximum allowed iteration number (i.e., Niter=32). As can be seen from FIG. 4, decoding fail of the $7^{th}$ code block of the codeword CW1 occurs due to CRC fail. Hence, decoding of the subsequent code blocks of the codeword CW1 is early terminated, and the subsequent code blocks of the codeword CW1 are regarded as having decoding fail due to TTI early termination. It should be noted that, at this moment, neither the codeword CW1 nor the codeword CW2 has code blocks waiting to be decoded due to TTI early termination, the maximum allowed iteration number is set to zero to skip the decoding procedure in the current TTI.

As mentioned above, the proposed TTI early termination, external buffer interface activity reduction, and adaptive iteration scheme are all controlled based on identification of decoding fail of a code block. When each code block has a dedicated CRC sequence, the decoding fail of a code block is easily identified when CRC fail occurs. However, in another case where each code block is not provided with a dedicated CRC sequence, an innovative decoding fail identification scheme is needed. The present invention therefore proposes using a hard decision aided (HDA) CRC sequence as an indicator to indicate correctness of a decoded code block. Further details are described as below.

Figure 5:
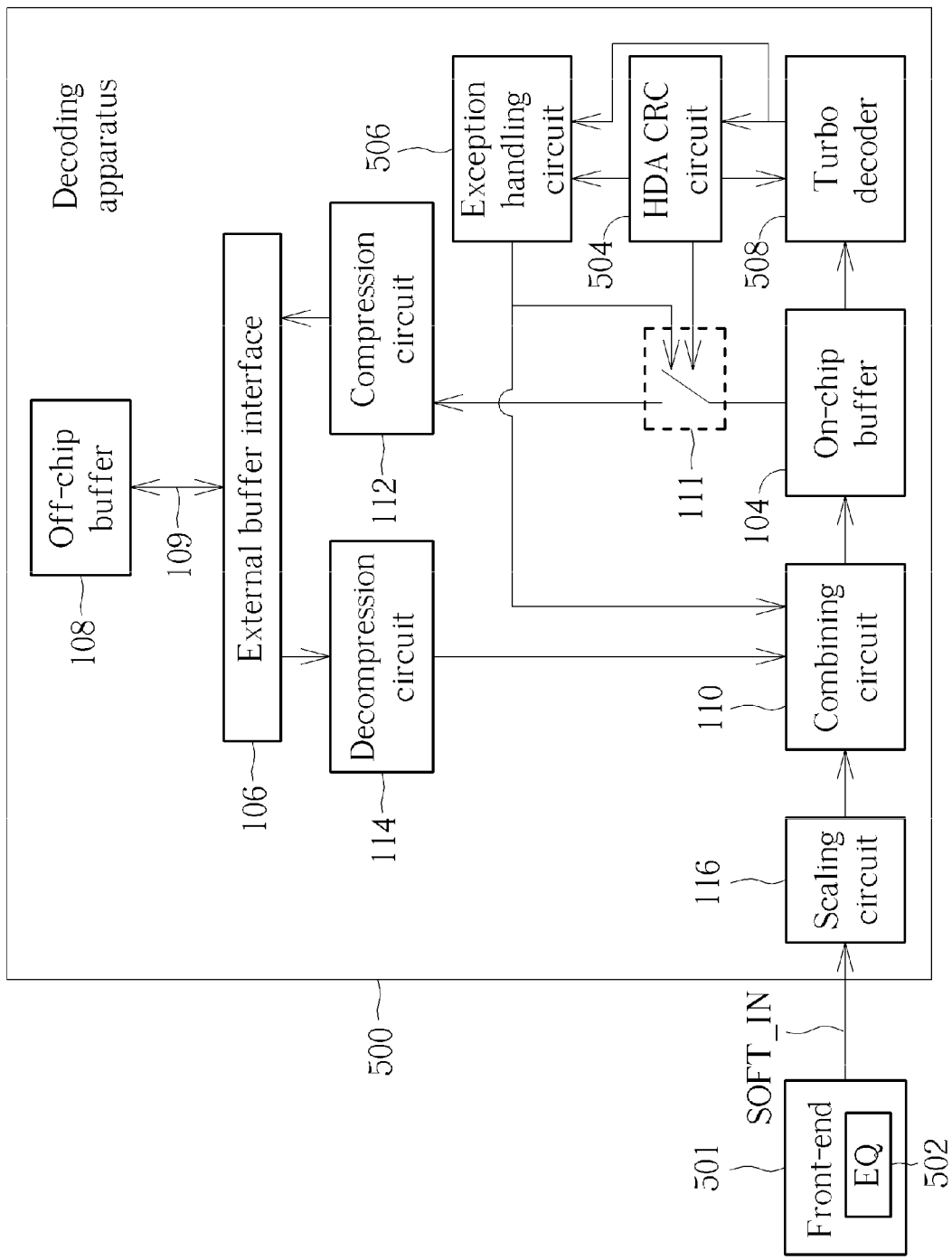
FIG. 5 is a diagram illustrating a decoding apparatus according to a second embodiment of the present invention.

FIG. 5 is a diagram illustrating a decoding apparatus according to a second embodiment of the present invention. The decoding apparatus 500 receives a MODEM soft input SOFT_IN from a preceding stage such as the front-end 501. For example, the MODEM soft input SOFT_IN may be derived from an output of an equalizer (EQ) 502. The major difference between the decoding apparatuses 100 and 500 is that the decoding apparatus 500 further includes an HDA CRC circuit 504 and an exception handling circuit 506. The decoding apparatus 500 may be employed in a communications system complying with a specific communications specification (e.g., a WCDMA specification) which specifies that each transport block in a codeword has a dedicated cyclic redundancy check (CRC) sequence, and each code block of the transport block has no dedicated CRC sequence. Hence, the turbo decoder 508 performs CRC check for the decoded transport block without performing CRC check for each decoded code block. Regarding the HDA CRC circuit 504, it is arranged for encoding a plurality of hard decision outputs respectively derived from a plurality of decoding iterations performed by the turbo decoder 508 upon a code block, and accordingly generating a plurality of HDA CRC sequences for the code block; and referring to the HDA CRC sequences to check if decoding fail of the code block occurs. Specifically, since the same consecutive HDA CRC sequences and the correctness of the code block are highly correlated, the HDA CRC circuit 504 may identify the decoding fail of the code block when there are no consecutive decoding iterations of the code block with the same HDA CRC sequence. For example, the HDA CRC circuit 504 determines that the code block is correctly decoded when HDA CRC sequences obtained by encoding two consecutive decoding iterations are the same. In addition, the decoding operation of a code block may be early terminated to skip any subsequent decoding iteration(s) when the maximum allowed iteration number is not reached yet and the same consecutive HDA CRC sequences are obtained.

Even though each code block is not provided with a dedicated CRC sequence, the decoding fail of the code block may be identified by means of HDA CRC sequences obtained by encoding hard decision outputs of decoding iterations of the code block. In this way, with help of the HDA CRC sequences used for detecting the decoding fail of a code block, one or more of the aforementioned TTI early termination, external buffer interface activity reduction and adaptive iteration scheme may still be employed in the decoding apparatus 500 for performance improvement and/or power consumption reduction. That is, since correctness of each decoded code block may be verified by using the HDA CRC sequences, the decoding apparatus 500 may operate like the decoding apparatus 100 to therefore benefit from the aforementioned TTI early termination, external buffer interface activity reduction and/or adaptive iteration scheme.

FIG. 6 is a diagram illustrating a first operational scenario of the decoding apparatus 500 shown in FIG. 5 according to an embodiment of the present invention. Suppose that a CRC-24 algorithm is employed to generate a 24-bit HDA CRC sequence for each decoding iteration of a code block. Regarding the $1^{st}$ code block of the transport block, HDA CRC sequences of two consecutive decoding iterations (i.e., $6^{th}$ iteration and $7^{th}$ iteration) are the same. Hence, correctness of the decoding result of the $1^{st}$ code block is identified. As no decoding fail of the $1^{st}$ code block is found, the external buffer interface activity reduction is active such that the external buffer interface 106 is not required to be enabled to transmit the $1^{st}$ code block in the on-chip buffer 104 to the off-chip buffer 108; besides, the TTI early termination is not active, and the adaptive iteration is not active. As can be seen from FIG. 6, no decoding fail is found in the following code blocks of the same transport block. Hence, the turbo decoder 508 remains active during the decoding procedure of the transport block, the external buffer interface 106 remains inactive during the decoding procedure of the transport block, and the maximum allowed iteration number initially employed by the turbo decoder 508 for the current transport block remains unchanged. In this example, the decoding result of the transport block passes the CRC check. Hence, no HARQ process is needed to perform retransmission and combination for any code block of the correctly decoded transport block. As a person skilled in the art can readily understand operational principles of TTI early termination, external buffer interface activity reduction and adaptive iteration scheme after reading above paragraphs, further description is omitted here for brevity.

FIG. 7 is a diagram illustrating a second operational scenario of the decoding apparatus 500 shown in FIG. 5 according to an embodiment of the present invention. Suppose that a CRC-24 algorithm is employed to generate a 24-bit HDA CRC sequence for each decoding iteration of a code block. Regarding the $1^{st}$ code block of the transport block, HDA CRC sequences of two consecutive decoding iterations (i.e., $6^{th}$ iteration and $7^{th}$ iteration) are the same. Similarly, regarding the $2^{nd}$ code block of the transport block, HDA CRC sequences of two consecutive decoding iterations (i.e., $4^{th}$ iteration and $5^{th}$ iteration) are the same. Hence, correctness of decoding results of the $1^{st}$ code block and $2^{nd}$ code block is identified through the same consecutive HDA CRC sequences. As no decoding fail of the $1^{st}$ code block/$2^{nd}$ code block is found, the external buffer interface activity reduction is active such that the external buffer interface 106 is not required to be active to transmit the $1^{st}$ code block/$2^{nd}$ code block in the on-chip buffer 104 to the off-chip buffer 108; besides, the TTI early termination is not active, and the adaptive iteration is not active. However, regarding the $3^{rd}$ code block, there are no consecutive decoding iterations with the same HDA CRC sequences when the maximum allowed iteration number (i.e., Niter=8) initially set for the current TTI is reached. Hence, the HDA CRC circuit 504 determines that the turbo decoder 508 fails to decode the $3^{rd}$ code block correctly, and therefore identifies decoding fail of the $3^{rd}$ code block due to HDA CRC fail. As decoding fail is detected, the HDA CRC circuit 504 controls the bus switch 111 to allow the $3^{rd}$ code block temporarily stored in the on-chip buffer 104 to be transmitted to the off-chip buffer 108 via the active external buffer interface 106, and further notifies the turbo decoder 508 to enable TTI early termination and/or adaptive iteration. As can be seen from FIG. 7, the subsequent code blocks (i.e., the $4^{th}$ code block to $6^{th}$ code block) of the same transport block are regarded as having decoding error due to TTI early termination, and the turbo decoder 508 therefore stops/skips decoding the subsequent code blocks. Besides, if more than one codeword is transmitted in the same TTI and another codeword still has code blocks needed to be decoded, the turbo decoder 508 may adjust the maximum allowed iteration number initially employed by the turbo decoder 508 to thereby enhance decoding performance of code blocks of another codeword.

The present invention proposes using HDA CRC sequences generated from encoding hard decision results of decoding iterations to verify correctness of a code block which has no dedicated CRC sequence included in a codeword generated and transmitted from a transmitter. Thus, under certain condition (e.g., a rare case where the communications system operates at high code rate and low SNR), an HDA CRC false alarm may occur. Please refer to FIG. 8, which is a diagram illustrating a third operational scenario of the decoding apparatus 500 shown in FIG. 5 according to an embodiment of the present invention. The HDA CRC circuit 504 determines that a correctly decoded code word is obtained when the same consecutive HDA CRC sequences are detected. However, in a case where the code block processed by the turbo decoder 508 still includes error bits but the same consecutive HDA CRC sequences are generated by the HDA CRC circuit 504, an HDA CRC false alarm occurs. As shown in FIG. 8, an HDA CRC sequence derived from encoding a correct hard decision result of the $3^{rd}$ code word should be 0x3EBAD0 instead of 0x51DEAF. As the iterative decoding operation of the $3^{rd}$ code block is early stopped at the $5^{th}$ iteration due to the same two consecutive HDA CRC sequences 0x51DEAF, a correct code word cannot be generated from the turbo decoder 508. As a result, even though the HDA CRC circuit 504 determines that each of the code blocks in the same transport block has been correctly decoded to be error-free, a decoding result of the whole transport block fails to pass the CRC check using the dedicated CRC sequence appended to the transport block, implying that the decoded transport block still has certain error bits. If such an HDA CRC false alarm is not removed, the transport block will always encounter decoding fail in the HARQ process. To solve the HDA CRC false alarm problem, the present invention proposes a false alarm handling mechanism realized using the exception handling circuit 506. Specifically, the exception handling circuit 506 is arranged to selectively enable or disable the HDA CRC circuit 504 by checking a false alarm criterion, where the HDA CRC circuit 504 is disabled when the false alarm criterion is met. By way of example, but not limitation, the false alarm criterion may be checked using a pre-decoding manner and/or a post-decoding manner. Further details are described as below.

Figure 9:
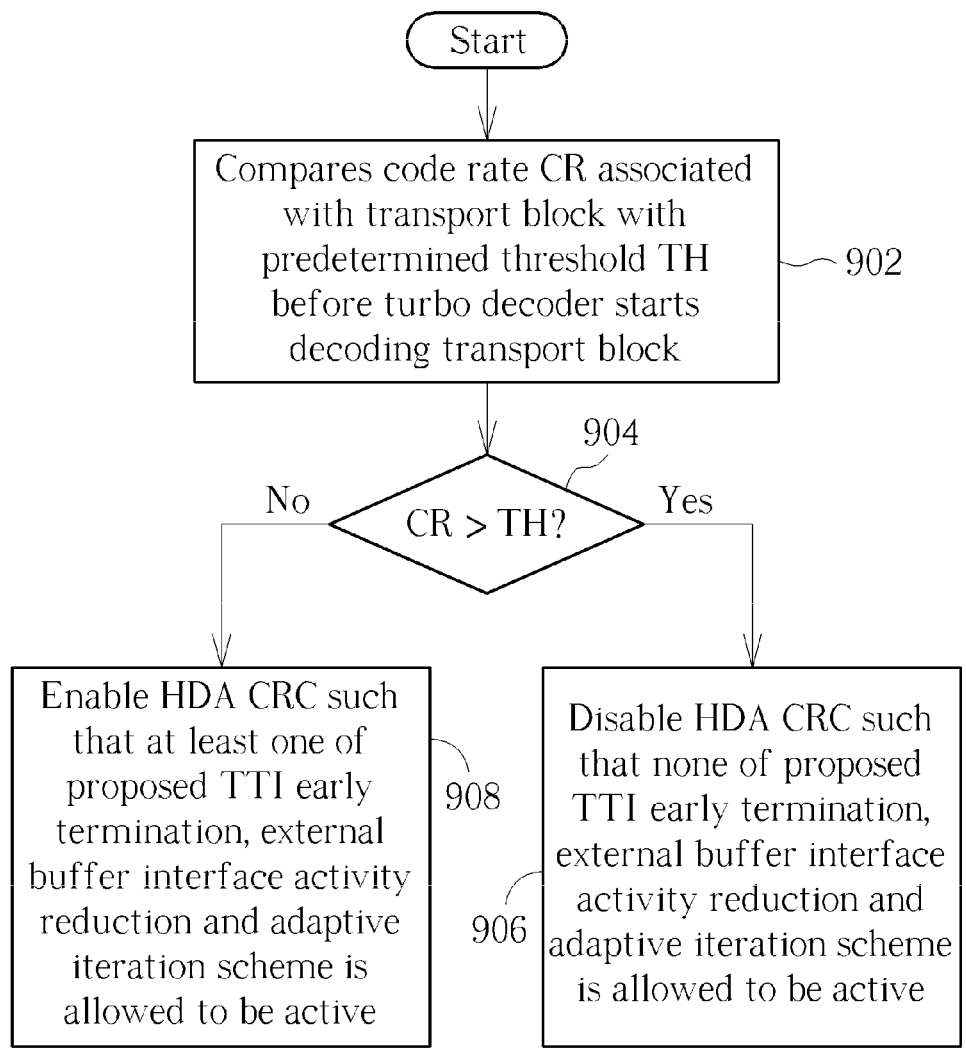
FIG. 9 is a flowchart illustrating a method of checking a false alarm criterion by a pre-decoding manner according to a first embodiment of the present invention.

FIG. 9 is a flowchart illustrating a method of checking a false alarm criterion by a pre-decoding manner according to a first embodiment of the present invention. In step 902, the exception handling circuit 506 compares a code rate CR associated with a transport block with a predetermined threshold TH before the turbo decoder 508 starts decoding the transport block. The code rate CR may be defined as a ratio of transport block bits to physical channel bits. In an extremely high code rate case, the probability of HDA CRC false alarm is high due to comparatively shorter CRC sequence appended to the transport block. In one exemplary design, the predetermined threshold TH may be set by 0.95. Therefore, when the exception handling circuit 506 finds that the code rate CR is higher than the predetermined threshold TH (i.e., the false alarm criterion is met), the HDA CRC circuit 504 is disabled by the exception handling circuit 506 (steps 904 and 906). As a result, during the decoding procedure of the transport block, the decoding apparatus 500 keeps the bus switch 111 switched on for transmitting each code block of the transport block from the on-chip buffer 104 to the off-chip buffer 108 via the external buffer interface 106 for further processing/ decoding, and neither the TTI early termination nor the adaptive iteration is enabled by the turbo decoder 508. When the exception handling circuit 506 finds that the code rate CR is not higher than the predetermined threshold TH (i.e., the false alarm criterion is not met), the HDA CRC circuit 504 is enabled by the exception handling circuit 506 (steps 904 and 908). As a result, at least one of the proposed TTI early termination, external buffer interface activity reduction and adaptive iteration scheme is allowed to be active during the decoding procedure of the transport block.

Figure 10:
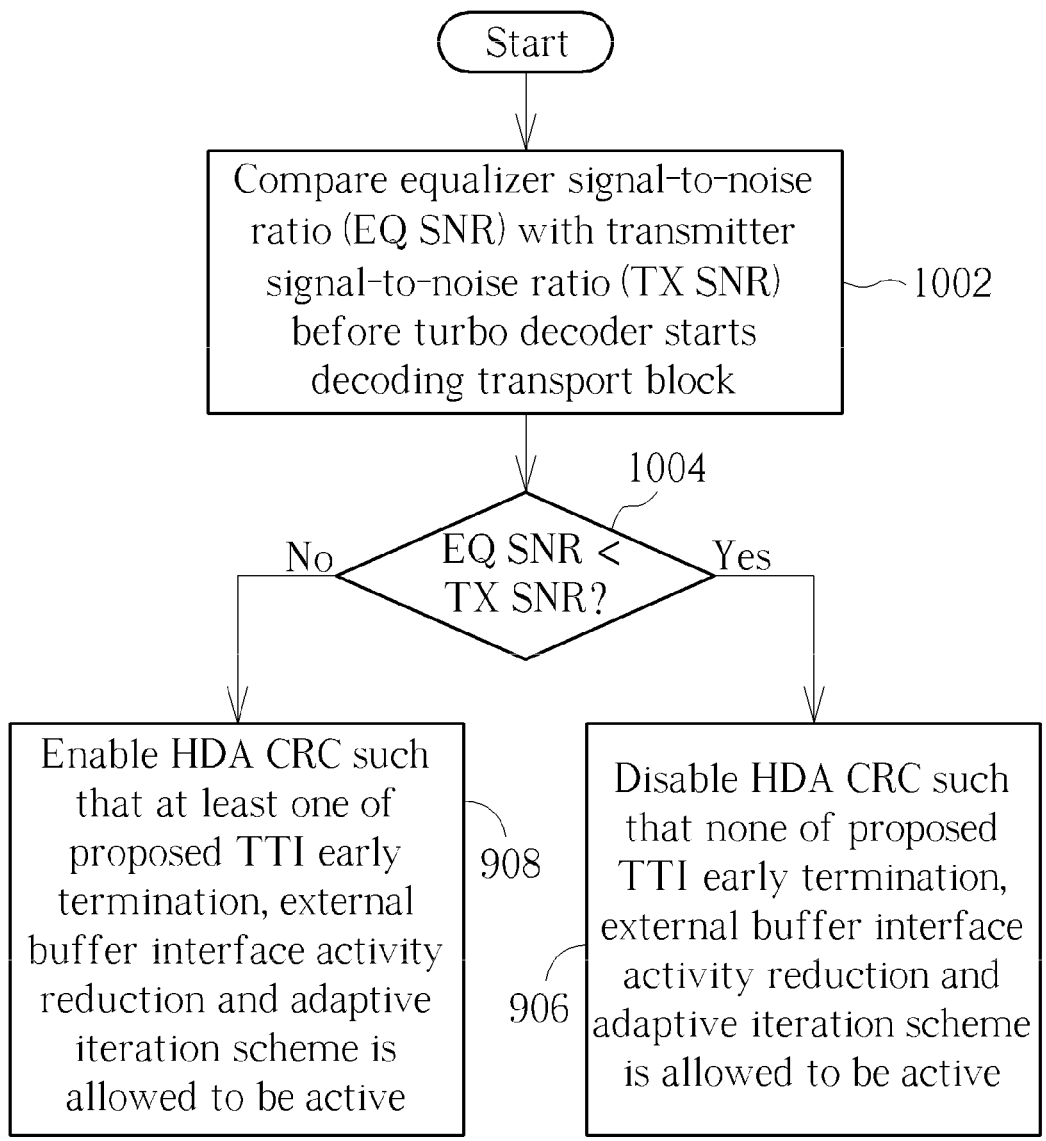
FIG. 10 is a flowchart illustrating a method of checking a false alarm criterion by a pre-decoding manner according to a second embodiment of the present invention.

FIG. 10 is a flowchart illustrating a method of checking a false alarm criterion by a pre-decoding manner according to a second embodiment of the present invention. In step 1002, the exception handling circuit 506 compares an equalizer signal-to-noise ratio (EQ SNR) with a transmitter signal-to-noise ratio (TX SNR) before the turbo decoder 508 starts decoding a transport block. The EQ SNR is indicative of an SNR of an output of the EQ 502, and may be provided by the front-end 501 preceding the decoding apparatus 500. Specifically, the EQ SNR is a quality indicator of the current input data. Regarding the TX SNR, it is indicative of signal quality at which the transport block can be decoded successfully. In this embodiment, the TX SNR may be estimated by referring to the transport block size, the downlink-shared channel (DSCH) code number, modulation type, octet alignment, etc. More specifically, a channel quality indication (CQI) criterion is checked to see if the false alarm criterion is met. When EQ SNR is lower than TX SNR, it implies that the signal quality of the currently received data is poorer than the minimum quality at which the transport block can be decoded successfully. Thus, when the exception handling circuit 506 finds that EQ SNR is lower than TX SNR (i.e., the false alarm criterion is met), the HDA CRC circuit 504 is disabled by the exception handling circuit 506 (steps 1004 and 906). As a result, during the decoding procedure of the transport block, the decoding apparatus 500 keeps the bus switch 111 switched on for transmitting each code block of the transport block from the on-chip buffer 104 to the off-chip buffer 108 via the external buffer interface 106 for further processing/ decoding, and neither the TTI early termination nor the adaptive iteration is enabled by the turbo decoder 508. When the exception handling circuit 506 finds that EQ SNR is not lower than TX SNR (i.e., the false alarm criterion is not met), the HDA CRC circuit 504 is enabled by the exception handling circuit 506 (steps 1004 and 908). As a result, at least one of the proposed TTI early termination, external buffer interface activity reduction and adaptive iteration scheme is allowed to be active during the decoding procedure of the transport block.

Figure 11:
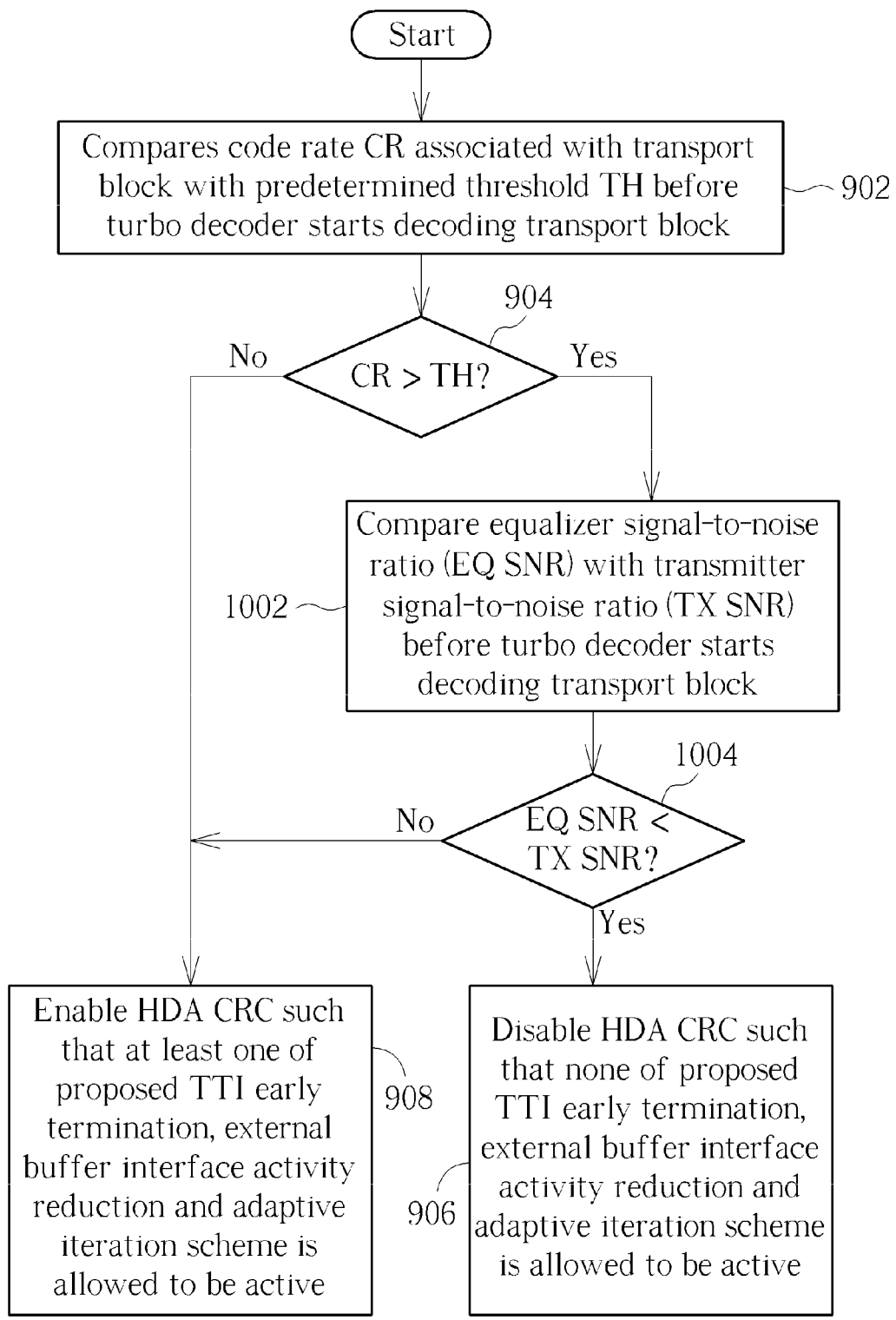
FIG. 11 is a flowchart illustrating a method of checking a false alarm criterion by a pre-decoding manner according to a third embodiment of the present invention.

Alternatively, the aforementioned checking rules may be jointly considered to determine whether the false alarm criterion is met. Please refer to FIG. 11, which is a flowchart illustrating a method of checking a false alarm criterion by a pre-decoding manner according to a third embodiment of the present invention. As can be seen from FIG. 11, it is determined that the false alarm criterion is met when the code rate CR is higher than the predetermined threshold TH and EQ SNR is lower than TX SNR. It should be noted that, if the result is substantially the same, the steps are not required to be executed in the exact order shown in FIG. 11.

Figure 12:
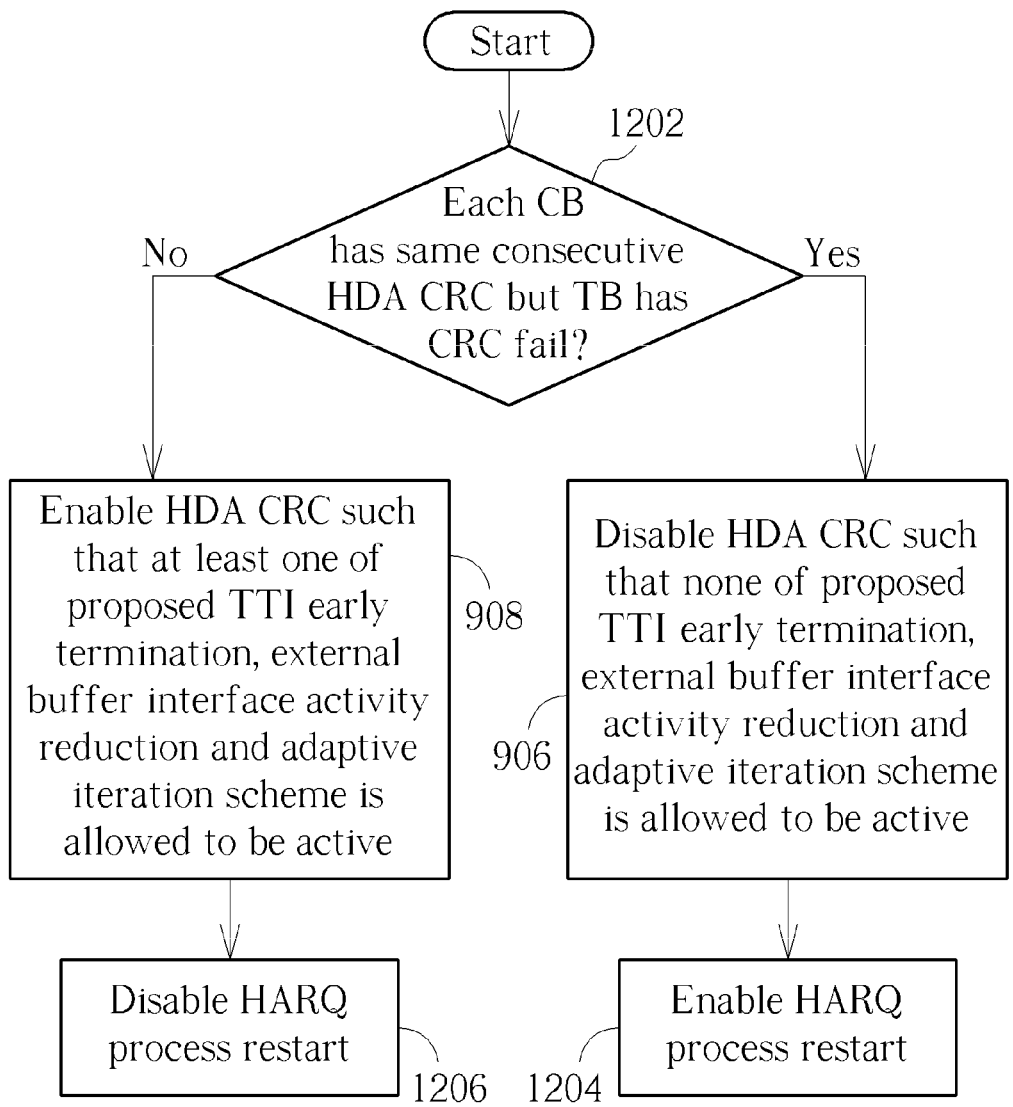
FIG. 12 is a flowchart illustrating a method of checking a false alarm criterion by a post-decoding manner according to an embodiment of the present invention.

FIG. 12 is a flowchart illustrating a method of checking a false alarm criterion by a post-decoding manner according to an embodiment of the present invention. As mentioned, a codeword received and processed by the decoding apparatus 500 includes a transport block and an appended CRC sequence for the transport block, where each code block included in the transport block has no dedicated CRC sequence. The HDA CRC circuit 504 is operative to check correctness of each decoded code block by referring to HDA CRC sequences obtained in successive decoding iterations, and the turbo decoder 508 is operative to check if the decoded transport block passes the CRC check based on its dedicated CRC sequence. As can be seen from FIG. 8, an HDA CRC false alarm occurs when each of the code blocks has the same consecutive HDA CRC sequences (e.g., at least two consecutive HDA CRC sequences each having the same value), and the transport block fails to pass the CRC check according to the appended CRC sequence in the codeword. In step 1202, the exception handling circuit 506 checks if the HDA CRC circuit 504 indicates that none of the code blocks has decoding fail and the turbo decoder 508 indicates that the transport block fails to pass the CRC check.

When the exception handling circuit 506 finds that each of the code blocks has the same consecutive HDA CRC sequences and the transport block fails to pass the CRC check (i.e., the false alarm criterion is met), the HDA CRC circuit 504 is disabled by the exception handling circuit 506 (steps 1202 and 906), and a HARQ process restart is triggered by the exception handling circuit 506 to be active (step 1204). When the HARQ process restart is enabled for a transport block which fails to pass the CRC check, the transport block is transmitted in the next transmission, and a re-decoding procedure starting from the first code block of the transport block with the HDA CRC circuit 504 disabled is performed. In other words, none of the aforementioned TTI early termination, external buffer interface activity reduction and adaptive iteration scheme is allowed to be active during the re-decoding procedure of the transport block. Thus, each code word of the transport block is decoded without any HDA CRC sequence generated, and each code word of the transport block is transmitted from the on-chip buffer 104 to the off-chip buffer 108 via the external buffer interface 106 for further decoding/ processing. In this way, the $2^{nd}$ code word shown in FIG. 8 can be correctly decoded by the turbo decoder 508 based on the maximum allowed iteration number (e.g., Niter=8).

When the exception handling circuit 506 finds that each of the code blocks has the same consecutive HDA CRC sequences and the transport block passes the CRC check (i.e., the false alarm criterion is not met), the HDA CRC circuit 504 is enabled by the exception handling circuit 506 (steps 1202 and 908), and a HARQ process restart is not triggered by the exception handling circuit 506 (step 1206). As a result, at least one of the proposed TTI early termination, external buffer interface activity reduction and adaptive iteration scheme is allowed to be active during the decoding procedure of the next transport block.

Figure 13:
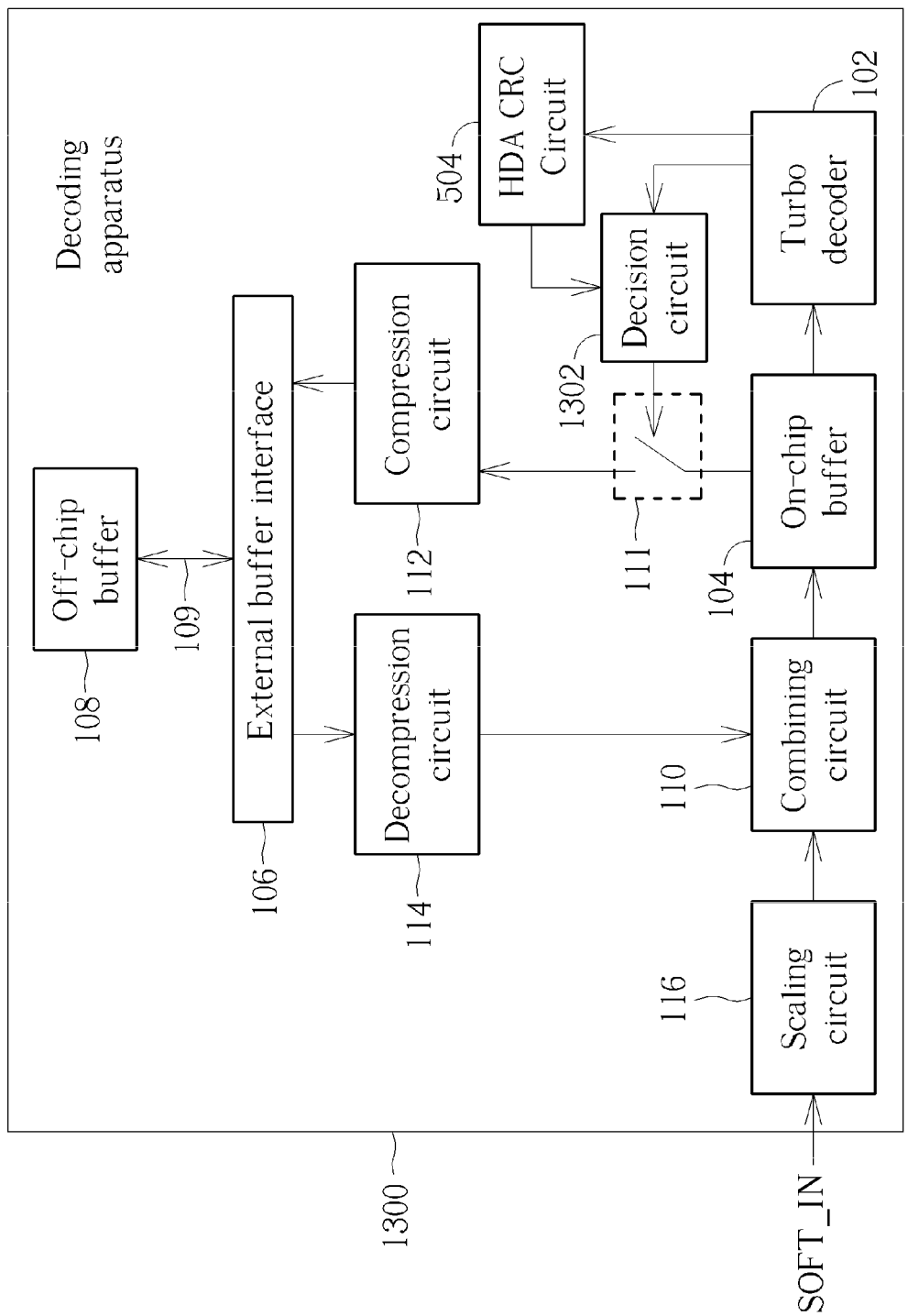
FIG. 13 is a block diagram illustrating a decoding apparatus according to a third embodiment of the present invention.

In above embodiment, the HDA CRC sequences are generated to determine whether the code block which has no dedicated CRC sequence transmitted via the codeword is correctly decoded. In other words, the HDA CRC sequence acts as a correctness indicator. In some conditions, it has little probability for each code block having the same consecutive HDA CRC sequences but the transport block has CRC fail. The HDA CRC false alarm only depends on high code rate, and may be regarded as a random error. Specifically, in most scenarios, the occurrence probability of the HDA CRC false alarm is extremely low due to the fact that the HDA CRC false alarm only occurs at a high code rate and low SNR condition. Hence, in an alternative design, the HDA CRC sequences additionally generated for a code block may collaborate with a dedicated CRC originally provided for the code block to improve the reliability of decoding the code block. For example, in an LTE or other communications system, a code block based two-stage CRC check scheme may be employed. Please refer to FIG. 13, which is a block diagram illustrating a decoding apparatus according to a third embodiment of the present invention. The major difference between the decoding apparatuses 100 and 1300 is that the decoding apparatus 1300 further includes a decision circuit 1302 and the aforementioned HDA CRC circuit 504. The HDA CRC circuit 504 is arranged for encoding a plurality of hard decision outputs respectively derived from a plurality of decoding iterations performed by the turbo decoder 102 upon a code block and accordingly generating a plurality of HDA CRC sequences, and referring to the HDA CRC sequences to verify correctness of the iterative decoding result of the code block. As each code block of a transport block has a dedicated CRC sequence in a codeword, the turbo decoder 102 is able to judge whether the currently decoded code block has a decoding fail according to the dedicated CRC. Hence, the decision circuit 1302 is arranged for checking if the decoding fail of the code block occurs according to verification results indicated by the turbo decoder 102 and the HDA CRC circuit 504. For example, the decoding fail of the code block is identified when each of the turbo decoder 102 and the HDA CRC circuit 504 indicates CRC fail of the code block. Similarly, at least one of the aforementioned TTI early termination, external buffer interface activity reduction and adaptive iteration scheme may operate in response to the judgment made by the decision circuit 1302.

It should be noted that TTI early termination, external buffer interface activity reduction and adaptive iteration scheme are not required to be employed in the same decoding apparatus. That is, any decoding apparatus using one of the proposed TTI early termination, external buffer interface activity reduction and adaptive iteration scheme falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoding apparatus comprising:
    an on-chip buffer, arranged for buffering each code block to be decoded;
    an external buffer interface, arranged for accessing an off-chip buffer;
    a turbo decoder, arranged for decoding a specific code block read from the on-chip buffer;
    wherein the specific code block is not transmitted from the on-chip buffer to the off-chip buffer via the external buffer interface unless decoding fail of the specific code block is identified.

2. The decoding apparatus of claim 1, wherein the specific code block which has a dedicated cyclic redundancy check (CRC) sequence in a codeword is stored into the on-chip buffer, and the turbo decoder checks if the decoding fail of the specific code block occurs by verifying correctness of an iterative decoding result of the specific code block according to the dedicated CRC sequence.

3. The decoding apparatus of claim 1, further comprising:
    a hard decision aided (HDA) CRC circuit, arranged for encoding a plurality of hard decision outputs respectively derived from a plurality of decoding iterations performed by the turbo decoder upon the specific code block and accordingly generating a plurality of HDA CRC sequences; and referring to the HDA CRC sequences to check if the decoding fail of the specific code block occurs.

4. The decoding apparatus of claim 3, wherein the HDA CRC circuit identifies the decoding fail of the specific code block when there are no consecutive decoding iterations of the specific code block with a same HDA CRC sequence.

5. The decoding apparatus of claim 3, further comprising:
    an exception handling circuit, arranged for checking a false alarm criterion to determine whether to enable the HDA CRC circuit;
    wherein the HDA CRC circuit is disabled when the false alarm criterion is met.

6. The decoding apparatus of claim 5, wherein the specific code block is part of a transport block; and the exception handling circuit compares a code rate associated with the transport block with a predetermined threshold, and determines that the false alarm criterion is met when at least the code rate is higher than the predetermined threshold.

7. The decoding apparatus of claim 5, wherein the specific code block is part of a transport block; and the exception handling circuit compares an equalizer signal-to-noise ratio (EQ SNR), indicative of an SNR of an EQ output, with a transmitter signal-to-noise ratio (TX SNR), indicative of signal quality at which the transport block is capable of being decoded successfully, and determines that the false alarm criterion is met when at least the EQ SNR is lower than the TX SNR.

8. The decoding apparatus of claim 5, wherein the specific code block is part of a transport block which has a dedicated CRC sequence in a codeword; regarding each of the code blocks, the HDA CRC circuit encodes a plurality of hard decision outputs respectively derived from a plurality of decoding iterations performed by the turbo decoder upon the code block and accordingly generating a plurality of HDA CRC sequences, and referring to the HDA CRC sequences to check if decoding fail of the code block occurs; the turbo decoder checks if decoding fail of the transport block occurs by verifying correctness of a decoding result of the transport block according to the dedicated CRC sequence; and the exception handling circuit determines that the false alarm criterion is met when the HDA CRC circuit indicates that none of the code blocks has the decoding fail and the turbo decoder indicates that the transport block has the decoding fail.

9. The decoding apparatus of claim 8, wherein when determining that the false alarm criterion is met, the HDA CRC circuit further triggers a hybrid automatic repeat request (HARQ) process restart for the transport block.

10. A decoding method comprising:
utilizing an on-chip buffer for buffering each code block to be decoded;
performing a turbo decoding operation for decoding a specific code block read from the on-chip buffer; and
transmitting the specific code block from the on-chip buffer to an off-chip buffer via an external buffer interface only when decoding fail of the specific code block is identified.

11. The decoding method of claim 10, wherein the specific code block which has a dedicated cyclic redundancy check (CRC) sequence in a codeword is stored into the on-chip buffer, and the turbo decoding operation checks if the decoding fail of the specific code block occurs by verifying correctness of an iterative decoding result of the specific code block according to the dedicated CRC sequence.

12. The decoding method of claim 10, further comprising:
performing a hard decision aided (HDA) CRC operation by:
encoding a plurality of hard decision outputs respectively derived from a plurality of decoding iterations performed by the turbo decoding operation upon the specific code block and accordingly generating a plurality of hard decision aided (HDA) CRC sequences; and
referring to the HDA CRC sequences to check if the decoding fail of the specific code block occurs.

13. The decoding method of claim 12, wherein the decoding fail of the specific code block is identified when there are no consecutive decoding iterations of the specific code block with a same HDA CRC sequence.

14. The decoding method of claim 12, further comprising:
checking a false alarm criterion to determine whether to perform the HDA CRC operation;
wherein the HDA CRC operation is not performed when the false alarm criterion is met.

15. The decoding method of claim 14, wherein the specific code block is part of a transport block; and the step of checking the false alarm criterion comprises:
comparing a code rate associated with the transport block with a predetermined threshold; and
determining that the false alarm criterion is met when at least the code rate is higher than the predetermined threshold.

16. The decoding method of claim 14, wherein the specific code block is part of a transport block; and the step of checking the false alarm criterion comprises:
comparing an equalizer signal-to-noise ratio (EQ SNR), indicative of an SNR of an EQ output, with a transmitter signal-to-noise ratio (TX SNR), indicative of signal quality at which the transport block is capable of being decoded successfully; and
determining that the false alarm criterion is met when at least the EQ SNR is lower than the TX SNR.

17. The decoding method of claim 14, wherein the specific code block is part of a transport block which has a dedicated CRC sequence in a codeword; regarding each of the code blocks, a plurality of hard decision outputs respectively derived from a plurality of decoding iterations performed by the turbo decoder upon the code block are encoded to generate a plurality of HDA CRC sequences, and the HDA CRC sequences are referenced for checking if decoding fail of the code block occurs; the turbo decoding operation checks if decoding fail of the transport block occurs by verifying correctness of a decoding result of the transport block according to the dedicated CRC sequence; and the step of checking the false alarm criterion comprises:
determining that the false alarm criterion is met when none of the code blocks is indicated as having the decoding fail and the turbo decoding operation indicates that the transport block has the decoding fail.

18. The decoding method of claim 17, further comprising:
when it is determined that the false alarm criterion is met, triggering a hybrid automatic repeat request (HARQ) process restart for the transport block.

19. A decoding method comprising:
performing a turbo decoding operation upon a specific code block which has a dedicated cyclic redundancy check (CRC) sequence in a codeword, wherein the turbo decoding operation further verifies correctness of an iterative decoding result of the specific code block according to the dedicated CRC sequence;
performing a hard decision aided (HDA) CRC operation by:
encoding a plurality of hard decision outputs respectively derived from a plurality of decoding iterations performed by the turbo decoding operation upon the specific code block and accordingly generating a plurality of HDA CRC sequences; and
referring to the HDA CRC sequences to verify correctness of the iterative decoding result of the specific code block; and
checking if a decoding fail of the specific code block occurs according to verification results indicated by the turbo decoding operation and the HDA CRC operation.

20. A decoding method comprising:
performing a turbo decoding operation upon a first transport block which includes a plurality of code blocks;
checking if a decoding fail of a specific code block of the code blocks occurs; and
when the decoding fail of the specific code block is identified, controlling the turbo decoding operation to stop decoding each subsequent code block of the first transport block.

21. The decoding method of claim 20, further comprising:
performing the turbo decoding operation upon a second transport block which includes a plurality of code blocks, wherein the first transport block and the second transport block are transmitted in a same transmission time interval (TTI); and
when the decoding fail of the specific code block is identified, adjusting a maximum allowed iteration number, and controlling the turbo decoding operation to decode at least one code block of the second transport block according to the adjusted maximum allowed iteration number.

* * * * *